(12) United States Patent
Underbrink et al.

(10) Patent No.: US 9,278,849 B2
(45) Date of Patent: Mar. 8, 2016

(54) MICRO-SENSOR PACKAGE AND ASSOCIATED METHOD OF ASSEMBLING THE SAME

(75) Inventors: James Robert Underbrink, Seattle, WA (US); Mark Sheplak, Gainesville, FL (US); Dylan Paul Alexander, Gainesville, FL (US); Tiffany Nichole Reagan, Jacksonville, FL (US); Jessica Caitlin Meloy, Valrico, FL (US)

(73) Assignees: The Boeing Company, Chicago, IL (US); University of Florida Research Foundation, Incorporated, Gainesville, FL (US)

( * ) Notice: Subject to any disclaimer, the term of this patent is extended or adjusted under 35 U.S.C. 154(b) by 660 days.

(21) Appl. No.: 13/524,141

(22) Filed: Jun. 15, 2012

(65) Prior Publication Data

US 2013/0336511 A1 Dec. 19, 2013

(51) Int. Cl.
*H04R 25/00* (2006.01)
*B81B 7/00* (2006.01)

(52) U.S. Cl.
CPC ......... *B81B 7/0006* (2013.01); *B81B 2207/096* (2013.01); *Y10T 29/4913* (2015.01)

(58) Field of Classification Search
CPC .................. H01L 2924/00; H01L 2224/48091; H01L 2924/0002; H01L 2924/00014; H01L 2924/10253; H01L 2924/3025; H01L 2224/73265; H01L 2224/48227; H01L 2224/32225; H01L 2224/48465; H01L 2224/48137; H01L 2224/16225; H01L 25/165
USPC ......... 381/173, 174, 175, 355, 360, 365, 369; 257/43, 414, 415, 416
See application file for complete search history.

(56) References Cited

U.S. PATENT DOCUMENTS

| 2008/0283991 | A1 | 11/2008 | Reinert |
| 2009/0268555 | A1 | 10/2009 | Underbrink et al. |
| 2010/0027830 | A1 | 2/2010 | Hsu et al. |
| 2010/0114534 | A1 | 5/2010 | Gratzer et al. |
| 2013/0037891 | A1* | 2/2013 | Huang et al. ................. 257/415 |

FOREIGN PATENT DOCUMENTS

| DE | 10 2008 042258 A1 | 4/2010 |
| EP | 1 978 555 A1 | 10/2008 |

OTHER PUBLICATIONS

International Search Report and Written Opinion mailed Oct. 7, 2013 for PCT/US2013/032811, 7 pages.
Williams et al., An AlN MEMS Piezoelectric Microphone for Aeroacoustic Applications, Journal of Microelectromechanical Systems, vol. 21, No. 2, Apr. 2012, pp. 270-283.
Canadian Office Action dated Aug. 12, 2015 for U.S. Appl. No. 2,870,476.
European Examination Report dated Sep. 9, 2015 for Application No. 13713693.3.

* cited by examiner

*Primary Examiner* — Davetta W Goins
*Assistant Examiner* — Phylesha Dabney
(74) *Attorney, Agent, or Firm* — Womble Carlyle Sandridge & Rice LLP

(57) ABSTRACT

A micro-sensor package is provided that includes a micro-sensor and printed circuit board (PCB), or that includes an array of micro-sensors and PCB. The micro-sensor includes a first substrate having opposing front and back surfaces, a sensing element on the front surface of the first substrate, and a through-chip via disposed within the first substrate and electrically connected to the sensing element. The PCB includes a second substrate to which the back surface of the first substrate is bonded. The second substrate defines a recess within which a bond pad is disposed, and the through-chip via of the micro-sensor is electrically connected to the bond pad of the PCB. The micro-sensor package may further include a shim bonded to the PCB, and that may surround an outer boundary of the micro-sensor and have approximately the same thickness as the micro-sensor.

21 Claims, 9 Drawing Sheets

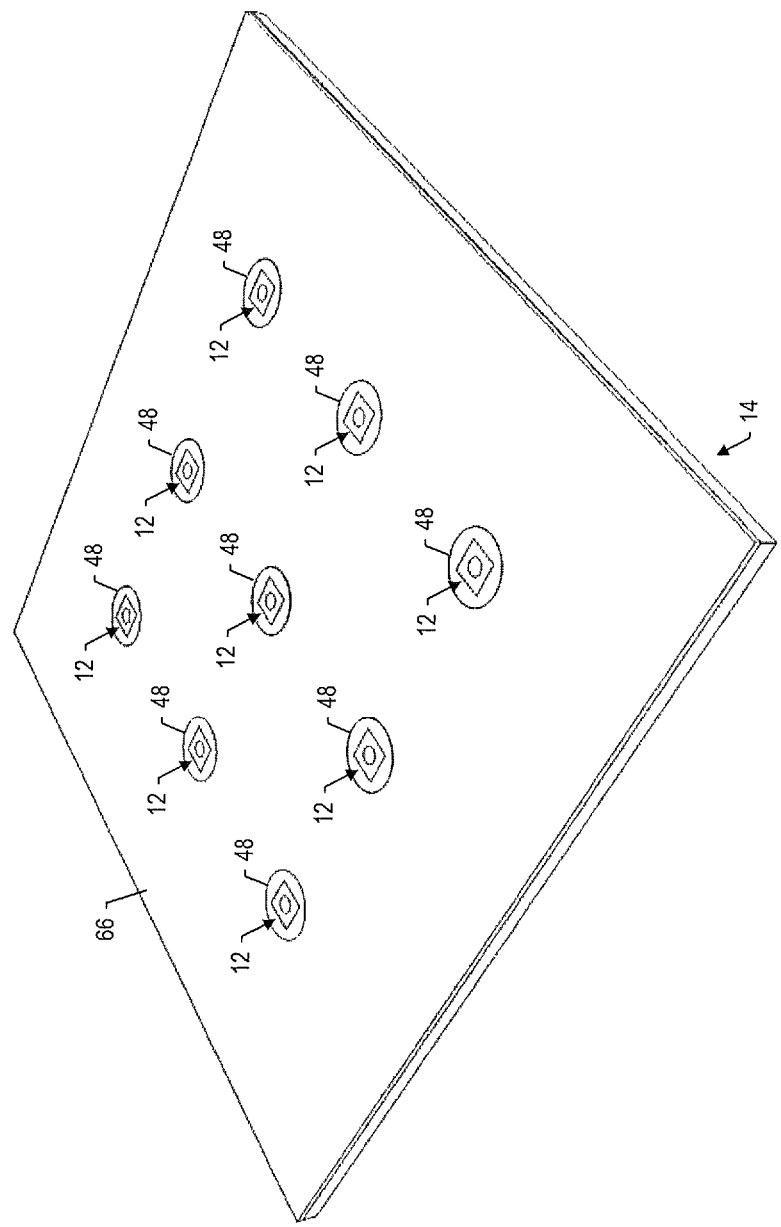

MICRO-SENSOR PACKAGE AND ASSOCIATED METHOD OF ASSEMBLING THE SAME

TECHNOLOGICAL FIELD

The present disclosure relates generally to sensors and, in particular, to sensor packages and associated methods of assembling the same.

BACKGROUND

The measurement of physical quantities is often performed to determine and understand the behavior of physical phenomena. For example, the measurement of noise and the sources or causes of noise is often performed to understand the physics behind the generation of noise. For example, a measurement may be performed to identify where the noise is coming from.

This type of analysis may be performed in the testing of devices. For example, noise data may be collected for an aircraft engine, such as a jet engine. The noise data collected may be analyzed to determine what components within and exterior to the jet engine contribute to the noise. These different components may also be referred to as component noise sources.

Different structures or components in a jet engine or in the jet exhaust generated by a jet engine may contribute different noises at different frequencies. For example, different surfaces within ducts and inlets of a jet engine may contribute noise during the operation of the jet engine. For example, the high speed exhaust flow of a jet engine may contribute noise during the operation of the engine.

Surfaces may be treated with various compounds or components in an effort to reduce noise. With this type of example, the jet engine may be tested with the different types of surfaces to determine whether a noise contribution from those surfaces is reduced with the different treatments.

Currently, arrays of microphones may be used to collect noise data. This noise data may be processed to produce a "picture" of where the noise is coming from, and to determine the intensity of the radiated noise. In obtaining this data, sound sensor units, such as microphones, may be placed at different locations. With current array designs, hundreds or thousands of array locations are needed to cover all the sound propagation paths formed by connecting hundreds of candidate noise source locations to dozens of measurement points of interest.

A number of different types of microphones have been investigated for use in aeroacoustic applications in which the microphones should satisfy a number of requirements. Microelectromechanical systems (MEMS) microphones are among the latest type of microphones showing promise. However, there is currently no known way to cost-effectively package MEMS sensors that meet the requirements of aeroacoustic applications. Therefore, it may be desirable to have a micro-sensor package and associated method of fabricating the same that takes into account at least some of the issues discussed above, as well as possibly other issues.

BRIEF SUMMARY

Example embodiments of the present disclosure are generally directed to a micro-sensor package and its associated method of assembly. The micro-sensor of example embodiments may be packaged to achieve an ultra-flush installation that is robust, EMI (electromagnetic interference) resistant, and, if desired, also ultra-thin for an individual sensor or group of sensors. The solution to this technical problem may enable a host of sensor deployment scenarios thereby enabling several applications for individual sensors and arrays of sensors that are not currently available. In the context of a microphone, for example, these deployment scenarios may include deployment of large channel count, high-fidelity noise source location arrays at previously inaccessible locations in wind tunnel test sections, and/or deployment of similar arrays on the exterior surface of airplane fuselages for in-flight test and measurement scenarios. The measurement fidelity afforded by example embodiments may be a substantial improvement over previous capabilities. Example embodiments may solve several technical challenges to achieve the desired sensor package results.

The micro-sensor package and its associated method of assembly of example embodiments may solve a number of technical challenges. For example, example embodiments may create an ultra-flush installation of a sensor such that its sensing element becomes part of a smooth surface with minimal disruption to the surface smoothness including positioning the sensing element in the plane of the smooth surface and doing so with insignificant gaps between the surface and the sensor. Example embodiments may also establish an EMI-resistant package, which may be particularly important for high impedance sensor designs that are typically vulnerable to EMI.

Example embodiments may further solve through-chip via attachment issues including bonding the sensor to a PCB (printed circuit board) simultaneously with sealing a sensor backside cavity and vent channel. Example embodiments may also solve the foregoing technical challenges for multi-sensor packages including precise positioning of sensors relative to one another. Further, example embodiments may create an individual sensor package incorporating the aforementioned EMI-resistant character and through-chip via attachment and back surface sealing. And example embodiments may solve the technical challenges in a method of fabricating a micro-sensor package.

According to one aspect of example embodiments, a micro-sensor package is provided that includes a micro-sensor and printed circuit board (PCB). The micro-sensor includes a first substrate having opposing front and back surfaces, a sensing element on the front surface of the first substrate, and a through-chip via disposed within the first substrate and electrically connected to the sensing element. The PCB includes a second substrate to which the back surface of the first substrate is bonded. The second substrate defines a recess within which a bond pad is disposed, and the through-chip via of the micro-sensor is electrically connected to the bond pad of the PCB. In one example, the PCB may include a via disposed within the second substrate and electrically connected to the bond pad opposite the through-chip via of the micro-sensor electrically connected to the bond pad.

In one example, the micro-sensor package may further include a shim bonded to the PCB, and that may surround an outer boundary of the micro-sensor and have approximately the same thickness as the micro-sensor. In this example, the second substrate may define another recess within which another bond pad is disposed, and the shim may be electrically connected to the other bond pad.

In one example, the through-chip via of the micro-sensor may be electrically connected to the bond pad with a conductive bonding agent disposed within an open volume of the recess above the bond pad. In this example, the open volume may be larger than the volume of the conductive bonding agent disposed therewithin. Also in this example, the back surface of the first substrate may be bonded to the PCB with an adhesive that surrounds and seals the conductive bonding agent.

In one example, the micro-sensor may include a diaphragm having a front surface defined by a portion of the front surface of the first substrate, and a back surface defined by a corresponding portion of the back surface of the first substrate within a cavity defined therein. In this example, the back surface of the first substrate may further define a vent channel connecting the cavity to the front surface of the first substrate. And the back surface of the first substrate may be bonded to the PCB with an adhesive that surrounds and seals the cavity, or cavity and vent channel.

In other aspects of example embodiments, a micro-sensor package including an array of micro-sensors, and a method of assembling a micro-sensor package, are provided. The features, functions and advantages discussed herein may be achieved independently in various example embodiments or may be combined in yet other example embodiments further details of which may be seen with reference to the following description and drawings.

BRIEF DESCRIPTION OF THE DRAWING(S)

Having thus described example embodiments of the disclosure in general terms, reference will now be made to the accompanying drawings, which are not necessarily drawn to scale, and wherein:

FIGS. 5a and 5b (collectively "FIG. 5") are perspective views of a micro-sensor package including an array of sensors according to example embodiments;

DETAILED DESCRIPTION

Figure 1A:
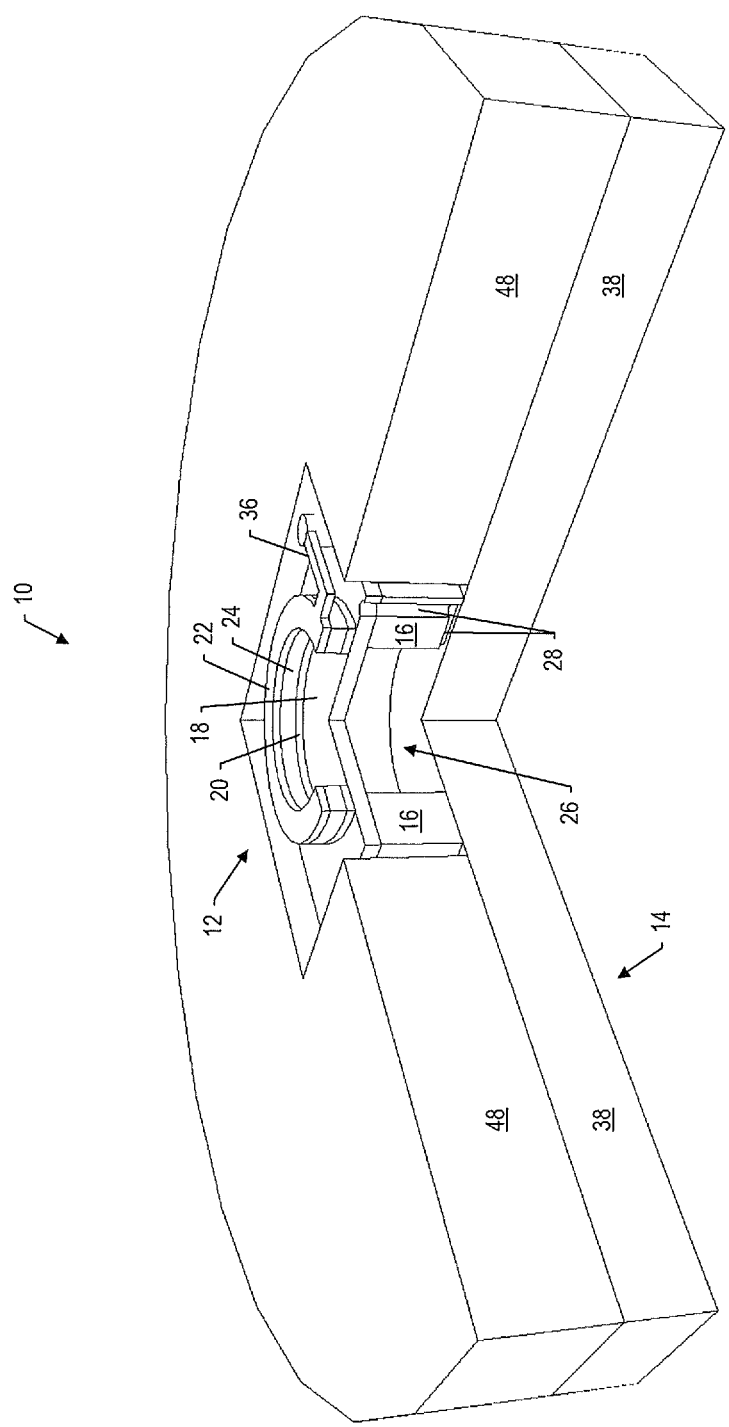
FIGS. 1a, 1b and 1c (collectively "FIG. 1") are quarter cutout, top and exaggerated cross-section views of a micro-sensor package according to one example embodiment.

Some embodiments of the present disclosure will now be described more fully hereinafter with reference to the accompanying drawings, in which some, but not all embodiments of the disclosure are shown. Indeed, various embodiments of the disclosure may be embodied in many different forms and should not be construed as limited to the embodiments set forth herein; rather, these example embodiments are provided so that this disclosure will be thorough and complete, and will fully convey the scope of the disclosure to those skilled in the art. For example, reference may be made herein to dimensions of components that may be related. Those and other similar relationships may be absolute or approximate to account for variations that may occur, such as those due to engineering tolerances or the like. Like reference numerals refer to like elements throughout.

Example embodiments may be described herein with reference to a MEMS sensor fabricated for a particular application such as an aeroacoustic application. It should be understood, however, that example embodiments may be equally applicable to other applications, both in and out of the aero-space industry. It should also be understood that example embodiments may be equally applicable to micro-sensors other than MEMS-based microphones.

Figure 1B:
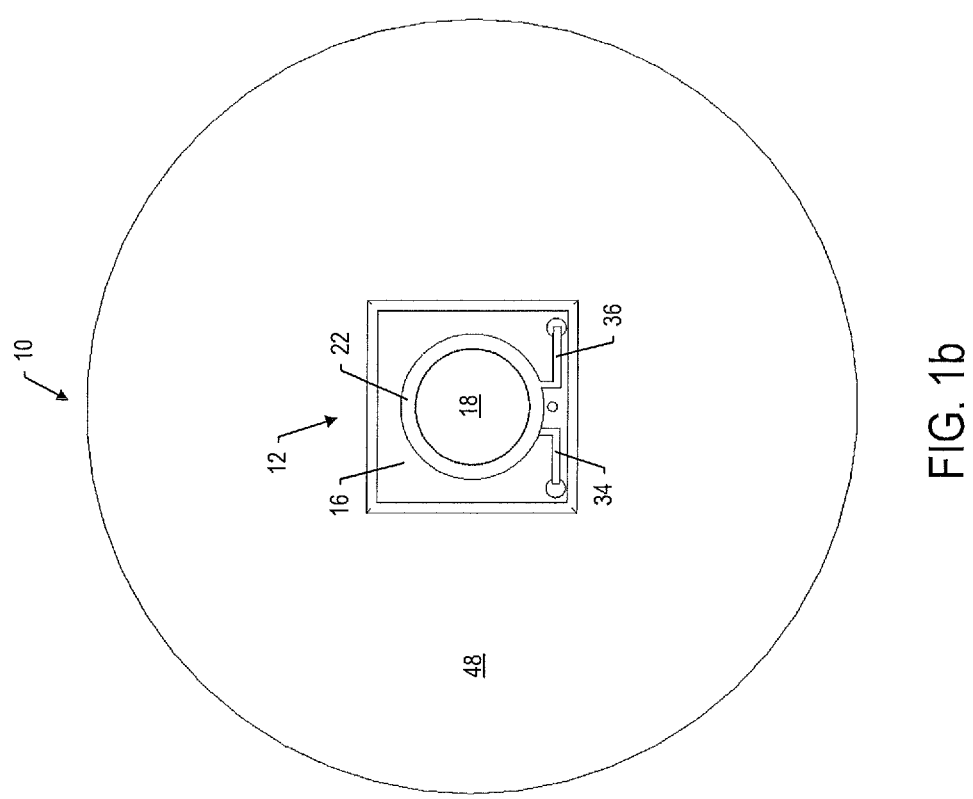
Figure 1C:
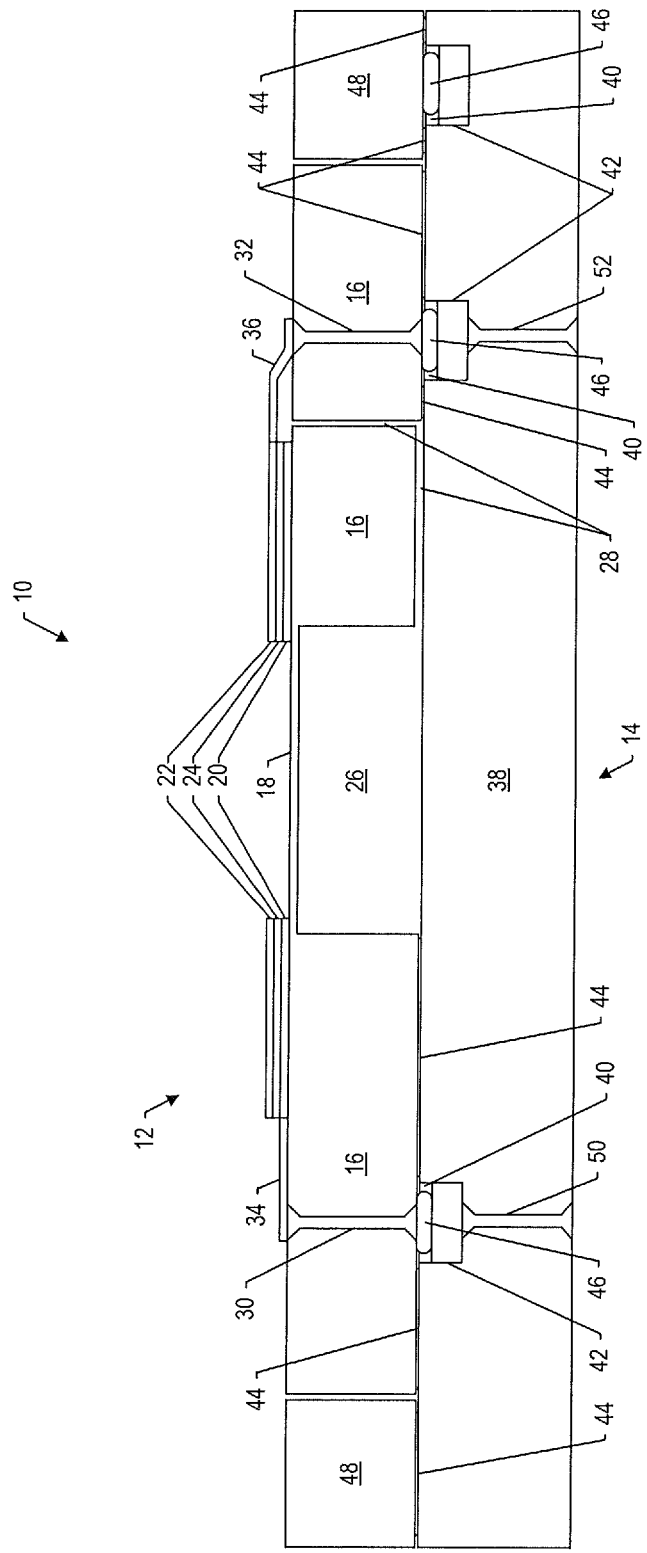

Referring to FIG. 1, including FIGS. 1a, 1b and 1c, illustrate a micro-sensor package 10 according to example embodiments of the present disclosure. FIGS. 1a and 1b are quarter cutout and top views of the micro-sensor package. FIG. 1c (and likewise FIGS. 2 and 3 described below) is a cross-section view exaggerated relative to FIGS. 1a and 1b to capture a number of components of the package that may not otherwise be captured by a true cross-section view.

As shown, the micro-sensor package may include a MEMS sensor 12 (microphone in this case) having opposing front and back surfaces, with the back surface being bonded or otherwise secured to a printed circuit board (PCB) 14. Again, as indicated above, the microphone shown is only one example of many sensors to which the sensor package and method of assembly of example embodiments may pertain. Also notably, the PCB is shown in FIG. 1 in a simplified form without other traces or electrical components that it may typically include.

Various features of the sensor 12 are shown and described herein to facilitate an understanding of example embodiments, but the sensor may include additional or alternative features. In one example, the sensor may include a substrate (first substrate) 16 having opposing front and back surfaces, and may include a sensing element on its front surface. As shown in the context of a microphone, the sensing element may be or otherwise include a stack of layers (e.g., annular stack of layers) surrounding an outer boundary of a diaphragm 18 (e.g., circular diaphragm). The stack of layers may include bottom and top electrodes 20, 22 and an interposed piezoelectric material 24. In one example, then, the diaphragm may be configured to deflect in response to incident acoustic pressure, which may in turn cause the stack of layers to produce a corresponding output voltage.

The diaphragm 18 may have a front surface defined by a portion of the front surface of the substrate, and a back surface defined by a corresponding portion of the back surface of the substrate within a cavity 26 defined therein. In one example, the back surface of the substrate may further define a vent channel 28 connecting the cavity to the front surface of the substrate so that both surfaces of the diaphragm may be exposed to the same static pressure. This may permit the sensor (microphone) to measure dynamic pressure free from sensing static pressure.

To capture an output voltage produced by the sensing element, it may be electrically connected to other electronics. In one example, then, the sensor 12 may include one or more through-chip vias disposed within substrate and electrically connected to the sensing element. In one example, the sensor may include two through-chip vias 30, 32 electrically connected to respective ones of the bottom and top electrodes 20, 22 by respective traces 34, 36. In one example in which the substrate is formed of silicon, the through-chip vias may be through-silicon vias (TSVs). These vias may enable back surface electrical connections to the sensor and more particularly its sensing element, rather than more typical front-surface electrical connections. Example embodiments may therefore avoid wire bonds typically required for front-surface electrical connections, and which may be fragile and disruptive to a smooth front surface for the sensor package 10.

It should again be noted that there may be details of the sensor 12 not shown or described herein, and that are outside the scope of the present disclosure. It should also be noted that FIG. 1 is not drawn to scale. The sensing element on the front surface of the substrate 16, and more particularly in one example the bottom and top electrodes 20, 22 and interposed piezoelectric material 24, may actually be much thinner relative to the thickness of the substrate. In one example, the sensing element may have a thickness of approximately 2 micrometers relative to a diaphragm 18 having a thickness of approximately 7 micrometers, and a substrate having a thickness of approximately 400 micrometers. The front surface of the sensor including the sensing element may therefore have a roughness of less than a few micrometers in a sensor package 10 having a desirable roughness of approximately 10 micrometers or less. The sensing element may therefore be so thin that the front surface of the sensor including the diaphragm may be considered smooth.

A challenge in the sensor package 10 may be to connect the vias 30, 32 to electronics required to power the sensor 12 and condition its output, and making the front surface of the sensor flush with that of the sensor package of which it is to become a part. And it may be even a greater challenge to achieve the above while sealing the cavity 26 and vent 28. In accordance example embodiments, the PCB 14 may include a substrate (second substrate) 38 that may define one or more recesses 40 within which respective bond pads 42 may be disposed. The recessed bond pads may be located on the PCB to permit one or more electrical connections between the sensor or its components and the PCB. These recessed bond pads may enable achieving a flush sensor package with a sealed cavity/vent.

The sensor 12 may be mechanically bonded to the PCB 14 with an appropriate adhesive 44 such as an epoxy, and may be electrically connected to the PCB with a conductive bonding agent 46. Examples of suitable conductive bonding agents include solder, conductive (e.g., silver) epoxy or the like. As another example, the conductive bonding agent may include a gold bump or stud and a suitable epoxy. In one example, the conductive bonding agent may more particularly electrically connect the vias 30, 32 and respective bond pads 42 which may be aligned with one another. The conductive bonding agent may be disposed within the recesses 40 including the bond pads, and may be disposed in an amount that does not exceed the open volume of respective recesses above the bond pads therein. The adhesive may surround the cavity 26 and vent 28 at the front surface of the PCB. The adhesive may thereby seal the electrical connection made by the conductive bonding agent, and seal the cavity and vent, and it may further provide a robust bond between the sensor and PCB.

A step may exist at the boundary between the front surface of the sensor 12 and the PCB 14. To account for the step and create a sensor package 10 with an overall relatively smooth surface, the sensor package may further include a shim 48 surrounding an outer boundary of the sensor and bonded to the PCB, such as with an appropriate adhesive 44. The shim may have approximately the same thickness as the sensor so that the entire sensor package may have a smooth surface on its front surface including the sensor diaphragm 18. The shim may be constructed of a conductive material (e.g., brass), and may be electrically connected to the sensor ground such that it may provide protection against electromagnetic interference (EMI). The shim may therefore be disposed over a recessed bond pad 42 of the PCB, and electrically connected to the bond pad with a conductive bonding agent 46. In one example, the respective recess 40, bond pad and conductive bonding agent may be arranged as explained above with respect to electrically connecting vias 30, 32 of the sensor to respective recessed bond pads. Also similar to before, the adhesive may seal the electrical connection made by the conductive bonding agent, and may provide a robust bond between the shim and PCB.

In one example, the sensor 12 may be completely packaged as a standalone unit with its cavity/vent 26, 28 sealed. In this regard, the PCB 14 may further include one or more vias within its substrate 38, two example vias 50, 52 being shown. The PCB vias may be disposed proximate and may be electrically connected to one or more of the recessed bond pads 42 opposite vias 30, 32 of the sensor electrically connected to respective recessed bond pads. The sensor package 10 may therefore be electrically connected to another electronic assembly by the PCB vias. Although not shown, in one example package, an electrical connection between the bond pad to which the shim 48 is electrically connected and sensor ground may be made with a trace on the PCB.

Figure 2:
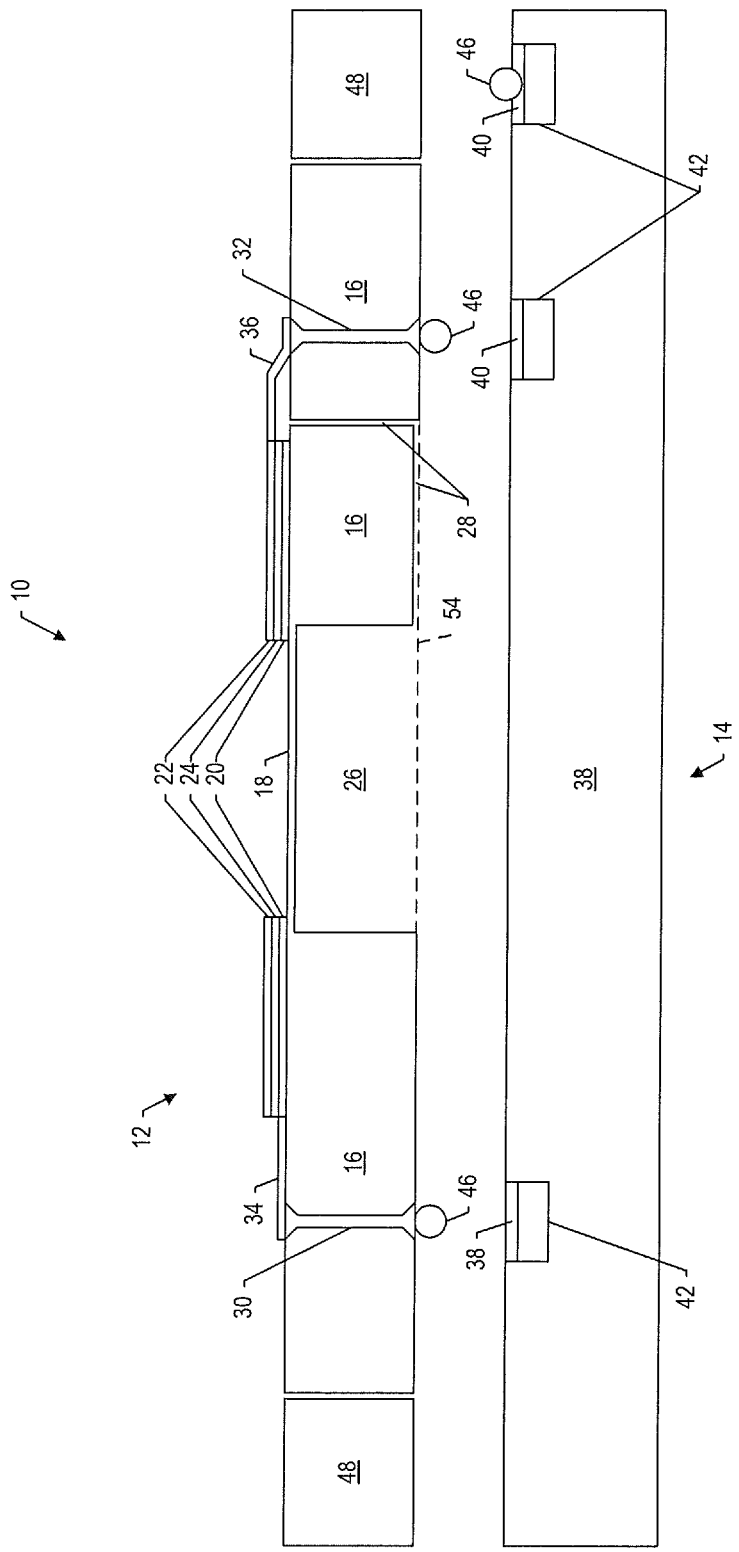
FIGS. 2 and 3 are exaggerated cross-section views of the micro-sensor package of FIG. 1 in various stages of assembly according to one example embodiment.
Figure 3:
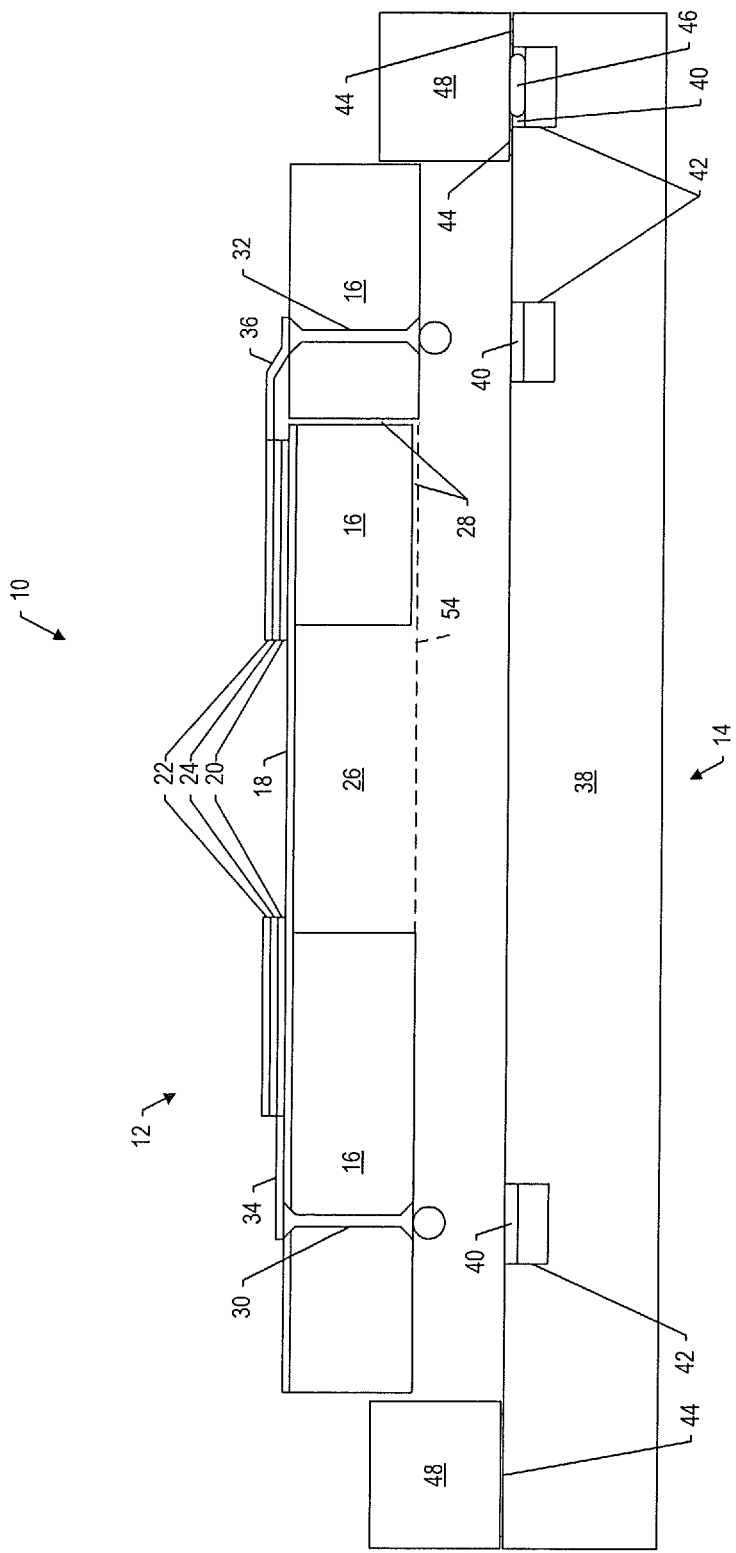

Reference is now made to FIGS. 2 and 3, and back to FIG. 1c, which relate to assembly of a sensor package 10 including a sensor 12, PCB 14 and shim 48, according to one example embodiment. In one example, assembly of the sensor package may be preceded by fabrication of the sensor, PCB and shim, each of which may be fabricated in accordance with any of a number of different processes, such as deposition and removal micromachining processes. More particularly, for example, fabrication of the sensor may include fabricating one or more through-chip vias 30, 32 through a substrate 16, and fabricating the sensing element on the front surface of the substrate, and electrically connecting the sensing element to the vias. More particularly, fabricating the sensing element of one example may include patterning and etching the front surface of the sensor to form bottom and top electrodes 20, 22 and interposed piezoelectric material 24. The back surface of the sensor may be etched to define the cavity 26 and vent 28. As shown in FIGS. 2 and 3, dotted line 54 represents a boundary that may be made during packaging after the sensor is fabricated to seal the cavity and vent. Other details regarding fabrication of the sensor are not germane to example embodiments and are therefore omitted from the present disclosure.

In one example, fabrication of the PCB 14 may include fabricating one or more vias 50, 52 in a substrate 38, and patterning and etching the front surface of the PCB to form one or more traces or other electrical components (not shown). The front surface of the PCB may be further etched to define one or more recesses 40 within which bond pads 42 may be deposited. Similar to the sensor, other details regarding fabrication of the PCB are not germane to example embodiments and are therefore omitted from the present disclosure.

Assembling the sensor 12, PCB 14 and shim 48 may include depositing a conductive bonding agent 46 over one or more vias 30, 32, bond pads 42 and/or shim for their electrical connection, as explained above. As shown in FIGS. 2 and 3, in one example, the conductive bonding agent may be deposited as balls that may be adhered (e.g., by a suitable epoxy) over vias on the back surface of the sensor substrate 16 for their electrical connection to respective PCB bond pads, and over another of the PCB bond pads for its electrical connection to the shim. In FIG. 2, the shim may be simultaneously bonded to the PCB both electrically with a conductive bonding agent and mechanically with an appropriate adhesive 44. As shown, the conductive bonding agent deposited as a ball may be compressed (e.g., as to form a bump or stud) in the recess 40 that has an open volume slightly larger than the volume of the conductive bonding agent.

In one example, the shim 48 and sensor 12 may be simultaneously bonded to the PCB 14. In another example, the shim may be bonded before the sensor. In this other example, by first bonding the shim to the PCB, the shim may provide a guide for bonding the sensor to the PCB. Similar to the shim, in FIG. 3, the sensor may be simultaneously bonded to the PCB both electrically with conductive bonding agent and mechanically with an appropriate adhesive 44, which may result in the sensor package 10 shown in FIG. 1c. Also similar to before, the conductive bonding agent deposited as balls may be compressed in respective recesses 40 that may each have an open volume slightly larger than the volume of the conductive bonding agent.

Figure 4:
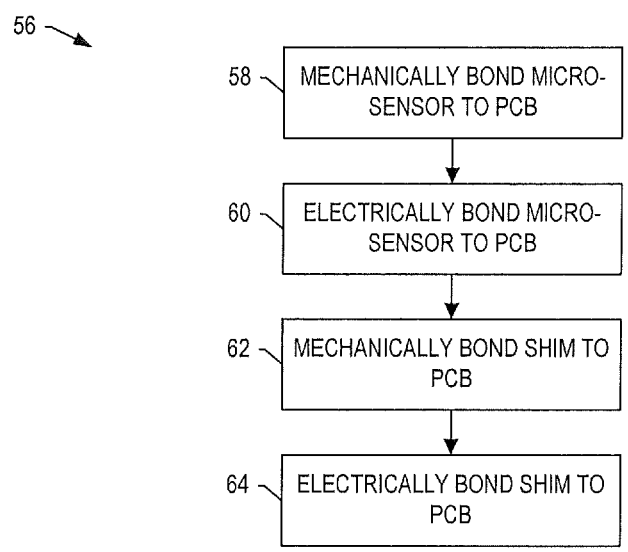
FIG. 4 is a flowchart illustrating various steps in a method of assembling a micro-sensor package according to one example embodiment.

FIG. 4 illustrates various steps in a method 56 of assembling a micro-sensor package 10 according to one example embodiment of the present disclosure. As shown at blocks 58 and 60, the method may include mechanically and electrically bonding a micro-sensor 12 to a printed circuit board 14, which in one example may occur simultaneously. The micro-sensor may include a first substrate 16 having opposing front and back surfaces, a sensing element on the front surface of the first substrate, and a through-chip vias 30, 32 (one or more) disposed within the first substrate and electrically connected to the sensing element. In one example, the micro-sensor may have a front surface with a roughness of less than a few micrometers in a sensor package having a desirable roughness of approximately 10 micrometers or less. The printed circuit board may include a second substrate 38 defining a recess 40 within which a bond pad 42 is disposed.

Mechanically bonding the micro-sensor 12 to the printed circuit board 14 may include bonding the back surface of the first substrate 16 to the second substrate 38. And electrically bonding the micro-sensor to the printed circuit board may include electrically bonding the through-chip vias 30, 32 of the micro-sensor to the bond pads 42 of the printed circuit board.

In one example, the electrical bonding may include electrically bonding the through-chip vias 30, 32 of the micro-sensor 12 to the bond pads 42 with a conductive bonding agent 46 deposited on the through-chip vias or bond pads, with the conductive bonding agent thereafter being disposed within an open volume of the recess above the bond pad. The mechanical bonding, then, may include mechanically bonding the back surface of the first substrate 16 to the printed circuit board 14 with an adhesive 44 that surrounds and seals the conductive bonding agent.

In one example, as shown in blocks 62 and 64, the method may further include mechanically and electrically bonding a shim 48 to the printed circuit board 14, which may occur before, after or simultaneously with bonding the sensor 12 to the printed circuit board. In this example, the micro-sensor and shim may be mechanically bonded to the printed circuit board such that the shim surrounds an outer boundary of the micro-sensor, and the shim may have approximately the same thickness as the micro-sensor. Also in this example, the second substrate may define another recess within which another bond pad is disposed. The electrical bonding may then include electrically bonding the shim to the other bond pad of the second substrate.

In one example, the micro-sensor 12 may include a diaphragm 18 having a front surface defined by a portion of the front surface of the first substrate 16, and a back surface defined by a corresponding portion of the back surface of the first substrate within a cavity 26 defined therein. In this example, the back surface of the first substrate may further define a vent channel 28 connecting the cavity to the front surface of the first substrate. The mechanical bonding may then include mechanically bonding the back surface of the first substrate to the printed circuit board 14 with an adhesive 44 that surrounds and seals the cavity and vent channel.

Figure 5B:
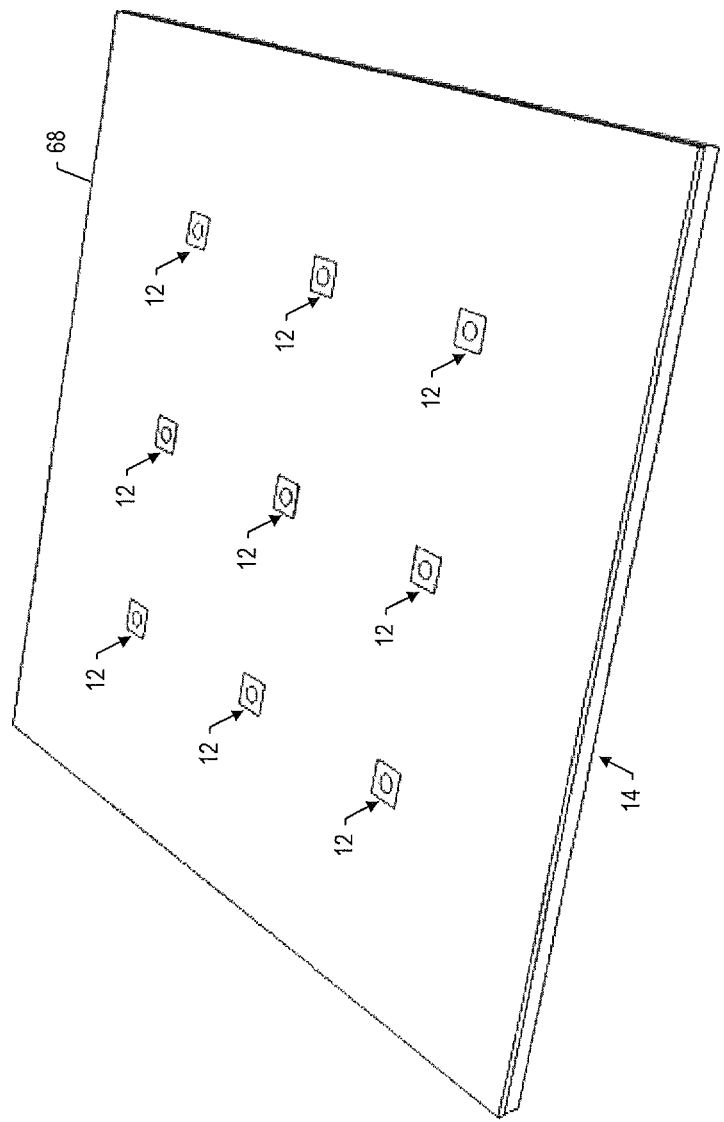

Turning now to FIG. 5, although the sensor package 10 may include a single sensor 12 bonded to the PCB 14, in another example, an array of sensors may be bonded to the PCB. The PCB in this other example may include an array of recessed bond pads 42 (an array of recesses 40 including a corresponding array of bond pads) for electrical connection to respective sensors. Also in this other example, the package may include one or more shims surrounding the sensors of the array. As shown in FIG. 5a, for example, the package may include a plurality of individual shims 48 surrounding respective sensors of the array, and may additionally include a single array shim 66 surrounding at least some if not all of the individual shims and respective sensors. In another example, as shown in FIG. 5b, the package may include a single array shim 68 surrounding at least some if not all of the sensors of the array without respective individual shims.

In one example, as shown in FIG. 5a, the array shim 66 may be fabricated to include cutouts in the shape of the individual shims 48 and respective sensors 12, and within which the shims and sensors may be disposed. In another example, as shown in FIG. 5b, the array shim 68 may be fabricated to include cutouts in the shape of the sensors without individual shims, and within which the sensors may be disposed. The sensor package including an array of sensors may be assembled in a manner similar to that described above, and may include bonding all of the sensors to the PCB at the same time or one by one. In one example, the array shim may be bonded before the array of sensors and any individual shims. The array shim may therefore provide a guide for bonding the sensors and any individual shims to the PCB 14. In a more particular example, the array shim may provide a guide for bonding the individual shims, which in turn may provide a guide for bonding the sensors. In any instance, however, by including backside electrical connections using vias through the sensors, the sensors of the array may be more precisely positioned relative to one another.

Figure 6:
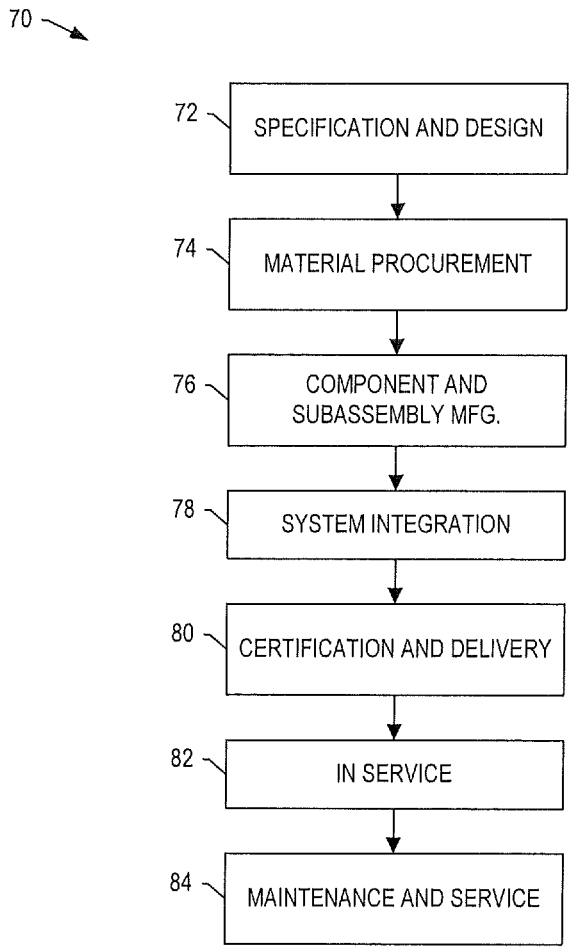
FIG. 6 is a flow diagram of an example aircraft production and service methodology.
Figure 7:
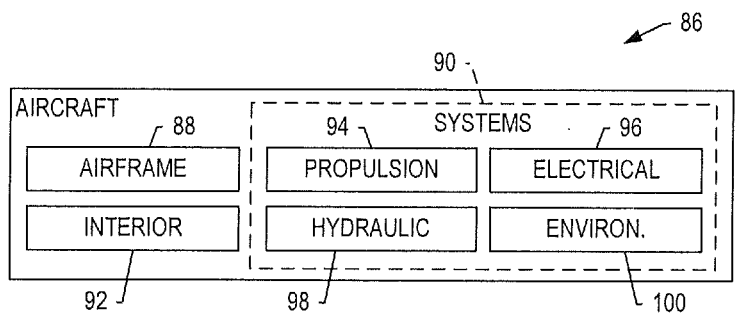
FIG. 7 is a block diagram of an example aircraft.

Example embodiments of the disclosure may find use in a variety of potential applications, particularly in the transportation industry, including for example, aerospace, marine and automotive applications. Thus, referring now to FIGS. 6 and 7, example embodiments may be used in the context of an aircraft manufacturing and service method 70 as shown in FIG. 6, and an aircraft 86 as shown in FIG. 7. During pre-production, example method may include specification and design 72 of the aircraft and material procurement 74. In one example, specification and design of the aircraft may include technology development and product definition, which may in turn include a test and evaluation component in which example embodiments may be employed. Example embodiments may also be employed in model scale test during technology and product development testing such as, for example, on a test model and/or on the walls or other mountable locations of a test facility (e.g., wind tunnel).

During production, component and subassembly manufacturing 76 and system integration 78 of the aircraft takes place. Thereafter, the aircraft may go through certification and delivery 80 in order to be placed in service 82. While in service by a customer, the aircraft is scheduled for routine maintenance and service 84 (which may also include modification, reconfiguration, refurbishment, and so on).

Each of the processes of method 70 may be performed or carried out by a system integrator, a third party, and/or an operator (e.g., a customer). For the purposes of this description, a system integrator may include without limitation any number of aircraft manufacturers and major-system subcontractors; a third party may include without limitation any number of venders, subcontractors, and suppliers; and an operator may be an airline, leasing company, military entity, service organization and so on.

As shown in FIG. 7, the aircraft 86 produced by example method 70 may include an airframe 88 with a plurality of systems 90 and an interior 92. Examples of high-level systems may include one or more of a propulsion system 94, an electrical system 96, a hydraulic system 98 or an environmental system 100. Any number of other systems may be included. Although an aerospace example is shown, the principles of the present disclosure may be applied to other industries, such as the automotive industry.

As suggested above, the apparatus and methods embodied herein may be employed during any one or more of the stages of the production and service method 70. For example, components or subassemblies corresponding to production process 76 may be fabricated or manufactured in a manner similar to components or subassemblies produced while the aircraft 86 is in service. Also, one or more apparatus embodiments, method embodiments or a combination thereof may be utilized during the production stages 76 and 78, for example, by substantially expediting assembly of or reducing the cost of an aircraft. Similarly, one or more of apparatus embodiments, method embodiments or a combination thereof may be utilized while the aircraft is in service, for example and without limitation, to maintenance and service 84.

Many modifications and other embodiments of the disclosure set forth herein will come to mind to one skilled in the art to which this disclosure pertains having the benefit of the teachings presented in the foregoing descriptions and the associated drawings. Therefore, it is to be understood that the disclosure is not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A micro-sensor package comprising:
    a micro-sensor comprising:
        a first substrate having opposing front and back surfaces;
        a sensing element on the front surface of the first substrate; and
        a through-chip via disposed within the first substrate and electrically connected to the sensing element;
    a printed circuit board including a second substrate with a front surface to which the back surface of the first substrate is bonded, the second substrate defining a recess within which a bond pad is disposed, the bond pad being disposed within the recess below the front surface of the second substrate such that the recess has an open volume above the bond pad, the through-chip via of the micro-sensor being electrically connected to the bond pad of the printed circuit board; and
    a shim surrounding an outer boundary of the micro-sensor and bonded to the printed circuit board, the shim having approximately the same thickness as the micro-sensor.

2. The micro-sensor package of claim 1, wherein the through-chip via of the micro-sensor is electrically connected to the bond pad with a conductive bonding agent disposed within the open volume of the recess above the bond pad, the open volume being larger than the volume of the conductive bonding agent disposed therewithin, and
    wherein the back surface of the first substrate is bonded to the printed circuit board with an adhesive that surrounds and seals the conductive bonding agent.

3. The micro-sensor package of claim 1, wherein the second substrate defines another recess within which another bond pad is disposed, the shim being electrically connected to the other bond pad.

4. The micro-sensor package of claim 1, wherein the micro-sensor includes a diaphragm having a front surface defined by a portion of the front surface of the first substrate, and a back surface defined by a corresponding portion of the back surface of the first substrate within a cavity defined therein, and
    wherein the back surface of the first substrate is bonded to the printed circuit board with an adhesive that surrounds and seals the cavity.

5. The micro-sensor package of claim 4, wherein the back surface of the first substrate further defines a vent channel connecting the cavity to the front surface of the first substrate, and the back surface of the first substrate is bonded to the printed circuit board with an adhesive that surrounds and seals the cavity and vent channel.

6. The micro-sensor package of claim 1, wherein the printed circuit board includes a via disposed within the second substrate and electrically connected to the bond pad opposite the through-chip via of the micro-sensor electrically connected to the bond pad.

7. A micro-sensor package comprising:
    an array of micro-sensors each of which comprises:
        a first substrate having opposing front and back surfaces;
        a sensing element on the front surface of the first substrate; and
        a through-chip via disposed within the first substrate and electrically connected to the sensing element; and
    a printed circuit board including a second substrate to which the back surface of the first substrate is bonded, the second substrate defining an array of recesses within which a corresponding array of bond pads is disposed, the through-chip via of each micro-sensor of the array of micro-sensors being electrically connected to a respective bond pad of the array of bond pads.

8. The micro-sensor package of claim 7, wherein for each micro-sensor of the array of micro-sensors, the through-chip via is electrically connected to a respective bond pad with a conductive bonding agent disposed within an open volume of the recess above the respective bond pad, and the back surface of the first substrate is bonded to the printed circuit board with an adhesive that surrounds and seals the conductive bonding agent.

9. The micro-sensor package of claim 7 further comprising:
    an array shim surrounding outer boundaries of the micro-sensors of the array of micro-sensors, the array shim being bonded to the printed circuit board and having approximately the same thickness as the micro-sensors.

10. The micro-sensor package of claim 9 further comprising:
    a plurality of individual shims surrounding outer boundaries of respective ones of the micro-sensors and bonded to the printed circuit board, the individual shims having approximately the same thickness as the micro-sensor,
    wherein the array shim surrounds the outer boundaries of the individual shims and micro-sensors of the array.

11. The micro-sensor package of claim 10, wherein the second substrate defines another plurality of recesses within which another plurality of bond pads is disposed, the individual shims being electrically connected to respective ones of the other plurality of bond pads.

12. The micro-sensor package of claim 7, wherein for each micro-sensor of the array of micro-sensors, the micro-sensor includes a diaphragm having a front surface defined by a portion of the front surface of the first substrate, and a back surface defined by a corresponding portion of the back surface of the first substrate within a cavity defined therein, and
   wherein for each micro-sensor of the array of micro-sensors, the back surface of the first substrate is bonded to the printed circuit board with an adhesive that surrounds and seals the cavity.

13. The micro-sensor package of claim 12, wherein the back surface of the first substrate further defines a vent channel connecting the cavity to the front surface of the first substrate, and for each micro-sensor of the array of micro-sensors, the back surface of the first substrate is bonded to the printed circuit board with an adhesive that surrounds and seals the cavity and vent channel.

14. The micro-sensor package of claim 7, wherein for each of one or more micro-sensors of the array of micro-sensors, the printed circuit board includes a via disposed within the second substrate and electrically connected to the bond pad opposite the through-chip via of the micro-sensor electrically connected to the bond pad.

15. A method of assembling a micro-sensor package comprising:
   mechanically bonding a micro-sensor to a printed circuit board, the micro-sensor including a first substrate having opposing front and back surfaces, a sensing element on the front surface of the first substrate, and a through-chip via disposed within the first substrate and electrically connected to the sensing element, the printed circuit board including a second substrate with a front surface and defining a recess within which a bond pad is disposed, the bond pad being disposed within the recess below the front surface of the second substrate such that the recess has an open volume above the bond pad, and mechanically bonding the micro-sensor to the printed circuit board including bonding the back surface of the first substrate to the front surface of the second substrate; and
   electrically bonding the micro-sensor to the printed circuit board, including electrically bonding the through-chip via of the micro-sensor to the bond pad of the printed circuit board; and
   mechanically bonding a shim to the printed circuit board, the micro-sensor and shim being mechanically bonded to the printed circuit board such that the shim surrounds an outer boundary of the micro-sensor, the shim having approximately the same thickness as the micro-sensor.

16. The method of claim 15, wherein the electrical bonding includes electrically bonding the through-chip via of the micro-sensor to the bond pad with a conductive bonding agent deposited on the through-chip via or bond pad, the conductive bonding agent after the electrical bonding being disposed within the open volume of the recess above the bond pad, the open volume being larger than the volume of the conductive bonding agent disposed therewithin, and
   wherein the mechanical bonding and electrical bonding occur simultaneously, and the mechanical bonding includes mechanically bonding the back surface of the first substrate to the printed circuit board with an adhesive that surrounds and seals the conductive bonding agent.

17. The method of claim 15, wherein the mechanical and electrical bonding of the micro-sensor includes mechanically and electrically bonding an array of micro-sensors to the printed circuit board, and
   wherein the mechanical bonding of the shim includes mechanically bonding an array shim to the printed circuit board such that the array shim surrounds outer boundaries of the micro-sensors of the array of micro-sensors.

18. The method of claim 17, wherein the mechanical bonding of the shim further includes mechanically bonding a plurality of individual shims to the printed circuit board such that the individual shims surround outer boundaries of respective ones of the micro-sensors, and such that the array shim surrounds the outer boundaries of the individual shims and micro-sensors of the array.

19. The method of claim 18, wherein the second substrate defines another plurality of recesses within which another plurality of bond pads is disposed, and wherein the method further comprises:
   electrically bonding the individual shims to the printed circuit board, including electrically bonding the individual shims to respective ones of the other plurality of bond pads.

20. The method of claim 15, wherein the micro-sensor includes a diaphragm having a front surface defined by a portion of the front surface of the first substrate, and a back surface defined by a corresponding portion of the back surface of the first substrate within a cavity defined therein, and
   wherein the mechanical bonding includes mechanically bonding the back surface of the first substrate to the printed circuit board with an adhesive that surrounds and seals the cavity.

21. The method of claim 20, wherein the back surface of the first substrate further defines a vent channel connecting the cavity to the front surface of the first substrate, and the mechanical bonding includes mechanically bonding the back surface of the first substrate to the printed circuit board with an adhesive that surrounds and seals the cavity and vent channel.

* * * * *